United States Patent
Yin et al.

(10) Patent No.: US 8,039,391 B1
(45) Date of Patent: Oct. 18, 2011

(54) METHOD OF FORMING A CONTACT IN A SEMICONDUCTOR DEVICE WITH ENGINEERED PLASMA TREATMENT PROFILE OF BARRIER METAL LAYER

(75) Inventors: Jinsong Yin, Sunnyvale, CA (US); Wen Yu, Fremont, CA (US); Connie Pin-Chin Wang, Menlo Park, CA (US); Paul Besser, Sunnyvale, CA (US); Keizaburo Yoshie, Cupertino, CA (US)

(73) Assignees: Spansion LLC, Sunnyvale, CA (US); Globalfoundries Inc., Grand Cayman (KY)

( * ) Notice: Subject to any disclaimer, the term of this patent is extended or adjusted under 35 U.S.C. 154(b) by 206 days.

(21) Appl. No.: 11/388,976

(22) Filed: Mar. 27, 2006

(51) Int. Cl.
   *H01L 21/44* (2006.01)
(52) U.S. Cl. .. 438/656; 438/664; 257/757; 257/E29.111
(58) Field of Classification Search .................. 438/656, 438/664; 257/757
   See application file for complete search history.

(56) References Cited

U.S. PATENT DOCUMENTS

| 5,627,102 A * | 5/1997 | Shinriki et al. ............... 438/648 |
| 5,747,116 A * | 5/1998 | Sharan et al. .................. 427/534 |
| 6,365,495 B2 | 4/2002 | Wang et al. |
| 6,436,819 B1 * | 8/2002 | Zhang et al. .................. 438/656 |
| 2003/0194859 A1 | 10/2003 | Huang |

* cited by examiner

*Primary Examiner* — Stephen W Smoot
*Assistant Examiner* — Vicki B Booker
(74) *Attorney, Agent, or Firm* — McDermott Will & Emery LLP

(57) ABSTRACT

A method of forming a contact in a semiconductor device provides a titanium contact layer in a contact hole and a MOCVD-TiN barrier metal layer on the titanium contact layer. Impurities are removed from the MOCVD-TiN barrier metal layer by a plasma treatment in a nitrogen-hydrogen plasma. The time period for plasma treating the titanium nitride layer is controlled so that penetration of nitrogen into the underlying titanium contact layer is substantially prevented, preserving the titanium contact layer for subsequently forming a titanium silicide at the bottom of the contact.

5 Claims, 3 Drawing Sheets

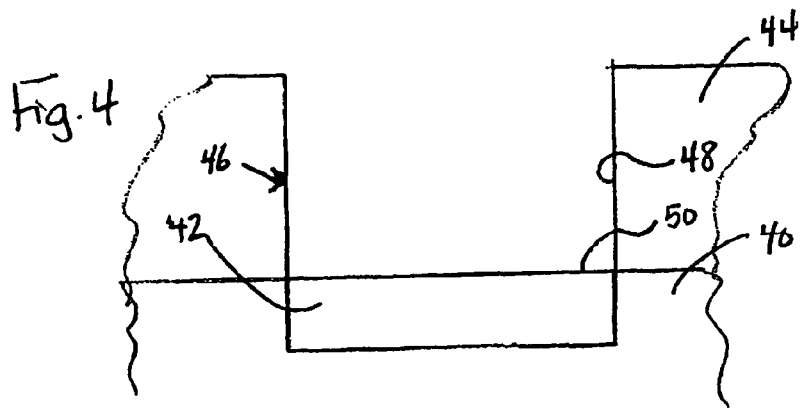
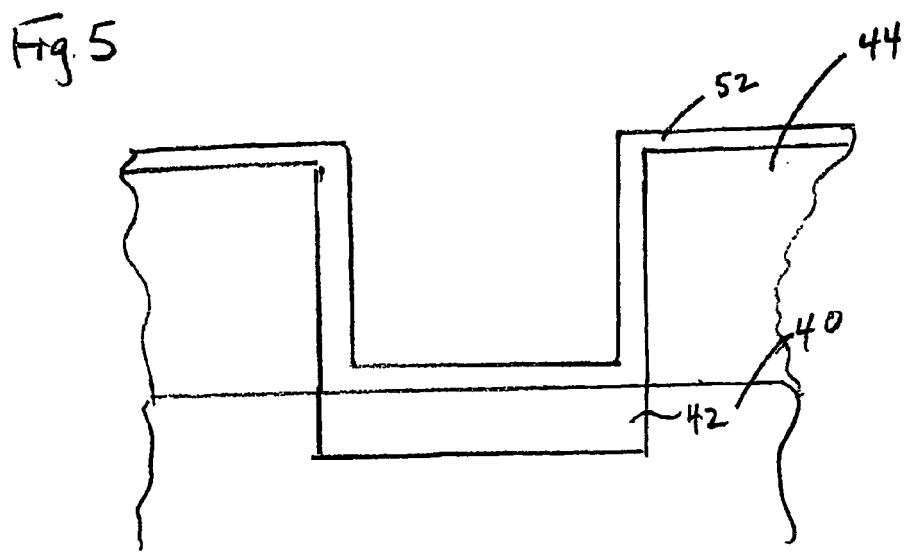
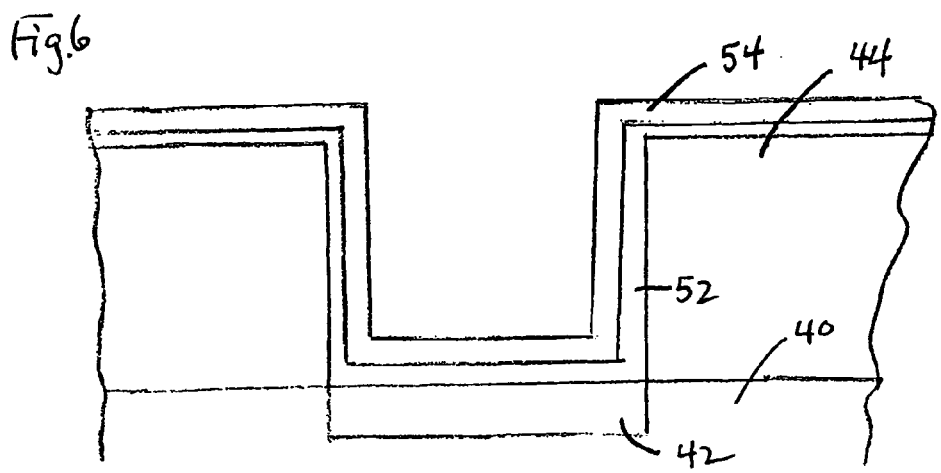

METHOD OF FORMING A CONTACT IN A SEMICONDUCTOR DEVICE WITH ENGINEERED PLASMA TREATMENT PROFILE OF BARRIER METAL LAYER

FIELD OF THE INVENTION

The present invention relates to the field of semiconductor processing, and more particularly, to the formation of contacts in a metallization process.

BACKGROUND OF THE INVENTION

Integrated circuits are manufactured as assemblies of various devices, such as transistors that make up a chip. In the process of manufacturing integrated circuits, after the individual devices, such as transistors, have been fabricated in the silicon substrate, the devices must be connected together to perform the desired circuit functions. This connection process is generally referred to as "metallization", and is performed using a number of different photolithographic and deposition techniques.

Contact plugs are employed to make a solid connection between an underlying device, for example, and an overlying interconnection conductive line, for example. The fabrication of a contact typically involves forming an opening in the dielectric layer and filling the opening with a metallic layer, such as aluminum or tungsten. However, aluminum or tungsten ions from the contact can migrate into a silicon substrate through a doped region, causing a short to the substrate. To minimize this shorting, many processing techniques deposit a barrier layer before depositing the aluminum or tungsten. One type of common barrier material is titanium nitride (TiN). While titanium nitride has a good barrier ability, it needs to be thick enough to effectively function as a barrier layer. As integrated circuit devices are defined more finely, the diameter of the contact shrinks and becomes more critical. Thus, a thick titanium nitride barrier metal layer is less desirable in more highly integrated circuits.

Another commonly used barrier layer is formed from metal organic CVD titanium nitride (MOCVD-TiN). Inherently, the MOCVD-TiN material contains impurities such as carbon, hydrogen and oxides, so that the resistance of MOCVD-TiN material is high. In order to reduce the resistance, one method removes these impurities by treating the barrier layer with a plasma gas containing an atmosphere of nitrogen and hydrogen. However, following the plasma gas treatment, the thickness of the MOCVD-TiN is substantially reduced. Consequently, the treated MOCVD-TiN layer thus formed has comparatively lower resistance, but the thickness should be adequate to function as a barrier layer effectively.

The effectiveness of the contact is limited by the contact resistance between the barrier metal layer and the doped regions in the substrate. Contact resistance is of particular concern in CMOS (complementary metal-oxide-silicon) technology. One approach to reduce the contact resistance is to deposit a conformal refractory metal layer into the opening, deposit the barrier metal on the refractory metal layer, and then perform a thermal process to effect a reaction between the metal and the silicon atoms of the substrate to form metal silicide. Since the metal silicide has a low resistance, consequently the contact resistance can be reduced.

One of the concerns of this methodology is that the plasma treatment to densify or reduce contaminants in the MOCVD-TiN layer affects the contact metal (titanium) underneath, especially in the case when titanium silicide formation is required for low contact resistance to the silicon substrate. This is due to the top portion of the titanium being easily converted to titanium nitride prior to being converted to titanium silicide in a subsequent rapid thermal anneal (RTA) step. The conversion of portions of the titanium to titanium nitride causes degradation of the contact resistance and distribution. Furthermore, in order to provide adequate titanium to form silicide, and compensate for the conversion of a portion of the titanium to titanium nitride, an excessive amount of titanium needs to be initially deposited. However, this raises concerns regarding overhang on the contact opening, as well as requiring additional titanium material for the process.

FIG. 2 depicts an $N_2/H_2$ plasma treatment in which the contact hole 20 has been provided with an initial titanium contact layer 22 followed by a barrier metal titanium nitride layer 24. This is provided on a silicon substrate 26. The $N_2/H_2$ plasma treatment is performed to reduce the resistance and remove impurities in the titanium nitride layer 24. However, as seen in FIG. 3, a portion of the titanium layer 22 is converted by the $N_2/H_2$ plasma treatment to an additional titanium nitride region 28. This reduces the amount of titanium that can react with the silicon to form silicide. This results in the structure of FIG. 3 following an annealing step to form silicide 30. The penetration of the $N_2/H_2$ plasma into the titanium through the titanium nitride layer 24, as shown in FIG. 2, therefore reduces the thickness of the titanium silicide 30 that is ultimately formed. Thus, in order to provide an adequate titanium silicide region, an excessive amount of titanium may be deposited to compensate for the conversion of some of the titanium to titanium nitride by the plasma treatment.

SUMMARY OF THE INVENTION

There is a need for an improved method of forming contacts in a semiconductor device that allows plasma treatment of a contact barrier metal layer, but still allows for the formation of silicide while preserving the thickness of a titanium contact layer as much as possible.

This and other needs are met by embodiments of the present invention which provide a method of forming a contact in a semiconductor device, comprising the steps of forming a contact hole in a dielectric layer on a substrate containing a conductive region, this contact hole exposing a portion of the conductive region. A contact layer is formed in the contact hole and on the conductive region portion. A barrier metal layer is formed on the contact layer. The barrier metal layer is plasma treated with a nitrogen-hydrogen plasma such that penetrated nitrogen concentration in the contact layer is less than certain level around 30 at. %. The silicide region is then formed at the conductive region portion by reacting the contact layer with the conductive region portion.

The earlier stated needs are also met by other embodiments of the present invention which provide a method of forming a contact in a semiconductor wafer, comprising the steps of forming a titanium layer in the contact hole and on a conductive region portion of a substrate exposed by the contact hole. A titanium nitride layer is then formed on the titanium layer. The titanium nitride layer is plasma treated with a nitrogen-hydrogen plasma with treatment conditions preventing penetration of nitrogen into the titanium layer.

The earlier stated needs are also met by a still further aspect of the present invention which provides a method of forming a contact in a semiconductor wafer, comprising the steps of forming a contact layer in a contact hole and on a conductive region portion of a substrate exposed by the contact hole. A barrier metal layer is formed on the contact layer to a thickness. The barrier metal layer is plasma treated with a nitrogen-hydrogen plasma for a determined amount of time based on the thickness of the barrier metal layer so as to remove impurities from the barrier metal layer and substantially prevent nitrogen from penetrating into the contact layer. Silicide is then formed at the conductive region portion.

By providing for a plasma treatment that prevents penetration of nitrogen into the contact layer, such as making the penetrated nitrogen concentration less than 30 at. %, conversion of the titanium contact layer to a titanium nitride is largely prevented so that the titanium layer is preserved to the greatest extent possible. Hence, a thinner initial titanium thickness may be deposited since the titanium is preserved for reaction with the silicon to form titanium silicide.

The foregoing and other features, aspects and advantages of the present invention will become more apparent from the following detailed description of the invention when taken in conjunction with the accompanying drawings.

BRIEF DESCRIPTION OF THE DRAWINGS

FIG. 4 shows the formation of a contact hole during the formation of a contact in accordance with embodiments of the present invention.

FIG. 5 depicts the structure of FIG. 4 after the deposition of a titanium layer in accordance with embodiments of the present invention.

FIG. 6 show the structure of FIG. 5 following the deposition of a titanium nitride layer in accordance with embodiments of the present invention.

DETAILED DESCRIPTION OF THE INVENTION

The present invention addresses and solves problems related to the formation of a contact in a semiconductor device, and particularly the problems arising from the plasma treatment provided to contact barrier metal layers and its effect on the contact metal underneath the barrier metal. This is achieved in the present invention, in part, by providing a plasma treatment profile that prevents penetrated nitrogen concentration from rising above 30 at. % in the titanium contact layer. This allows the titanium to adequately form a silicide with the underlying silicon in the substrate, and at the same time providing for an adequate plasma treatment of the titanium nitride barrier metal layer. This has the effect of obtaining better contact with improved electrical performance for 65 nm, 45 nm technologies and beyond.

Figure 1:
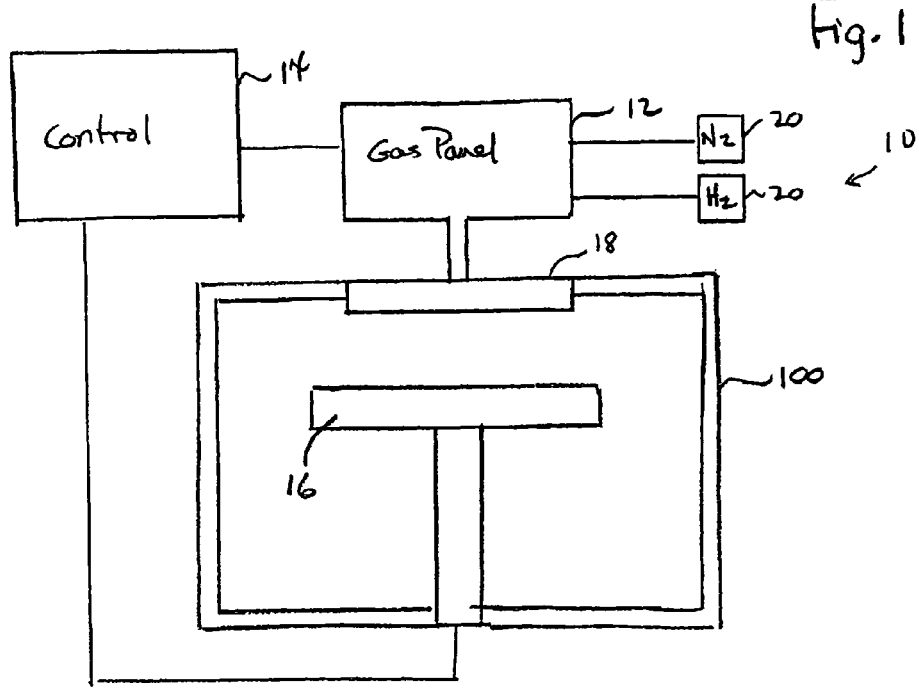
FIG. 1 is a schematic cross-sectional view of an apparatus used for deposition and plasma treatment of the barrier metal in accordance with the present invention.

FIG. 1 is a schematic, cross-sectional view of a barrier metal layer deposition and plasma treatment apparatus that may be used in accordance with the present invention. The system 10 includes a process chamber 100, a gas panel 12, a control unit 14, along with other hardware components such as power supplies and vacuum pumps (not shown). A support pedestal 16 is heated by an embedded heater element (not shown). The pedestal 16 may be heated by resistive heating, as is well known. Wafer temperature may be controlled by control of the pedestal temperature through the control unit 14.

Gas is supplied to the chamber 100 through a showerhead 18 from gas supply sources 20. The gas supply sources 20 may include, for example, a hydrogen supply and a nitrogen supply of gas. The showerhead 18 is also used to provide the plasma treatment of the deposited barrier metal layer. The above description of the MOCVD deposition chamber and annealing chamber is exemplary only, as other conventional chambers may be used to perform the method of the present invention.

Referring now to FIG. 4, a silicon substrate 40 has a contact region 42 formed therein. The contact region 42, or "conductive region portion" 42, may comprise, for example, a doped region, a silicon-based conductive line, a silicon-based gate structure, and the like. A dielectric layer 44 is formed on the silicon substrate 40 in a conventional manner. The dielectric layer 44 may comprise any suitable material or materials, such as low k dielectric materials or conventional materials such as silicon oxide and doped silicon-dioxide. The structure of FIG. 4 shows a contact hole 46 that has been formed in the dielectric layer 44. The contact hole 46 has a sidewall 48 and exposes an upper surface 50 of the conductive region portion 42. Conventional techniques for etching the contact hole 46 and forming the conductive region portion 42 may be employed.

FIG. 5 shows the structure of FIG. 4 following the deposition of a refractory metal contact layer 52 in accordance with embodiments of the present invention. The refractory metal contact layer 52 may be deposited by any conventional methodology, such as by physical vapor deposition (PVD), for example. The refractory metal contact layer 52 may consist of titanium, in certain embodiments of the invention. The thickness of the refractory metal contact layer 22 may be less than in conventional contact formation methodologies, since the titanium will not be subject to substantial nitridation caused by exposure to plasma treatment, as will be described. For example, in conventional contact methodologies, the nitridation of the titanium in the refractory metal contact layer 22 requires a greater amount, (i.e., a thicker layer) of titanium on the upper surface 50 of the conductive region portion 42 in order to provide an effective amount of silicide. As a nonlimiting example, conventional methodologies may require approximately 80 to 100 Å of titanium in order to produce 100 to 200 Å of titanium silicide at the conductive region portion 42. By contrast, the present invention allows a smaller amount of titanium to be provided at the bottom of the contact hole 46, since the titanium will not become significantly nitridated. For example, in certain embodiments of the invention, about 40 to about 50 Å of titanium may be provided at the bottom of the contact hole 46 in order to produce about 80 Å to about 100 Å of silicide in the present invention. In other words, the thickness of the refractory metal contact layer 52 on the conductive region portion 12 is between about 40% to about 60% of the thickness of the silicide region that will be formed by reacting the refractory metal contact layer 52 with the conductive region portion 42.

By depositing a lesser amount of refractory metal than employed in conventional methodologies, overhang of the contact hole 46 is reduced, as well as saving material consumption. Alternatively, if the same thickness of refractory metal layer 52 is employed as in conventional methodologies, a lower contact resistance will be achieved since the effective thickness of the refractory metal layer 52 is greater in the present invention as it is not subject to a nitridation process.

Figure 2:
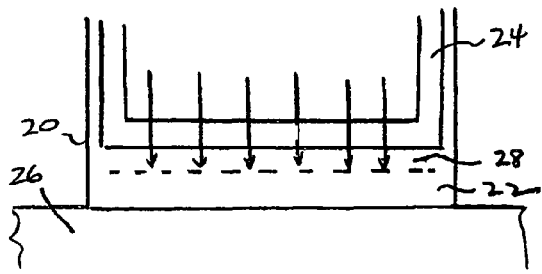
FIG. 2 is a schematic depiction of a cross-section of a portion of a semiconductor wafer during plasma treatment of a barrier metal layer of a contact hole in accordance with a prior art methodology.

FIG. 6 depicts the structure of FIG. 5 following the deposition and formation of a barrier metal layer 54 on the refractory metal contact layer 52. The deposition may be by a conventional MOCVD method, for example, using a precursor such as tetrakis-diemethylamido-titanium (TDMAT) or tetrakis-diethylamido-titanium (TDEAT). Using a conventional MOCVD-TiN deposition technique, a layer of MOCVD-TiN is deposited as barrier metal layer 54 in embodiments of the present invention. As discussed earlier, MOCVD-TiN material inherently contains impurities such as carbon, hydrogen and oxides, so that the resistance of this material is high. To reduce this resistance, it is known to remove the impurities by treating the barrier layer 54 with a plasma gas containing an atmosphere of nitrogen-hydrogen. This reduces the thickness of the MOCVD-TiN. However, as also discussed earlier, the inventors have recognized that the plasma treatment of the MOCVD-TiN layer affects the contact metal titanium underneath, especially in the case when titanium silicide formation is required for low contact resistance of a silicon substrate. This is due to portions of the titanium being easily converted to titanium nitride prior to being converted to titanium silicide in a subsequent RTA step. This situation was depicted in FIGS. 2 and 3. To avoid this, the present invention provides a timed plasma treatment of the MOCVD-TiN of the barrier metal layer 54 that is dependent on the thickness of the barrier metal layer 54. This engineered plasma treatment assures complete treatment of the MOCVD-TiN of the barrier metal layer 54, while at the same time substantially preventing penetration of nitrogen into the contact layer 52, which would convert titanium into titanium nitride in this layer. Previous methodologies fail to consider the underlying titanium and conversion of the titanium into titanium nitride during the plasma treatment of the MOCVD-TiN. Also, the previous methodologies do not take into consideration the thickness of the MOCVD-TiN of the barrier metal layer 54 when determining the process time for the plasma treatment.

Figure 3:
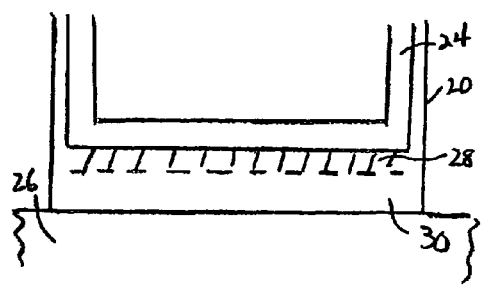
FIG. 3 shows the structure of FIG. 2 following the formation of silicide in accordance with prior art methodologies.
Figure 7:
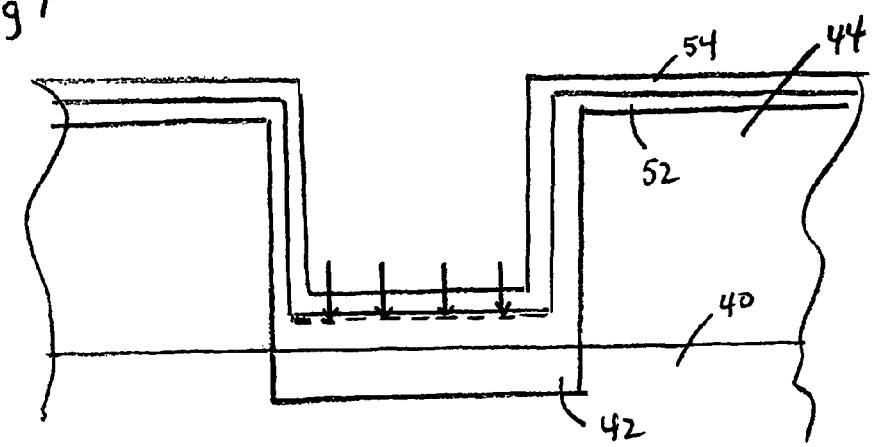
FIG. 7 shows the structure of FIG. 6 during the plasma treatment of the titanium nitride layer in accordance with embodiments of the present invention.

The plasma treatment of the present invention is depicted in FIG. 7, which may be compared to prior art FIG. 3. The comparison shows that the nitride of the plasma treatment does not substantially enter the titanium of the metal contact layer 52 during the plasma treatment. This is due to strict control of the plasma treatment process. In certain embodiments of the invention, the plasma treatment is an $N_2/H_2$ plasma treatment conducted with RF power being applied to the showerhead 18 via an RF supply with a power of about 750 W. The chamber walls and pedestal form the RF ground. Hydrogen may be provided with a flow rate of about 450 sccm, and nitrogen may be provided with a flow rate of about 300 sccm, with a pressure in the range of 1 to 2 torr. These values are exemplary only, however. An RF frequency in the range of approximately 325 kHz to approximately 375 MHz and power in the range of 700 to 850 W can be used for the plasma treatment, with the aforementioned power of about 750 W being preferred, as well as a frequency of about 350 kHz RF signal being preferred.

The present invention provides for controlling the time of the plasma treatment in accordance with the thickness of the barrier metal layer 54. In preferred embodiments of the invention, a plasma treatment of 35 seconds (assuming a RF power of 750 W) is provided for every 60 Å of thickness of the barrier metal layer 54. This approximately 35/60 ratio assures complete treatment of the titanium nitride of the barrier metal layer 54, while preventing any substantial penetration of the nitrogen into the underlying titanium of the metal contact layer 52. Hence, the thickness of the titanium at the bottom of the contact hole 46 is not substantially affected by the plasma treatment of the MOCVD-TiN in the barrier metal layer 54. Thus, depending upon the thickness of the barrier metal layer 54, the exposure to the plasma treatment is adjusted accordingly using the 35/60 ratio or another appropriately determined ratio that prevents penetration of the nitrogen into the titanium of the metal contact layer 52 while still completely treating the barrier metal layer 54.

Figure 8:
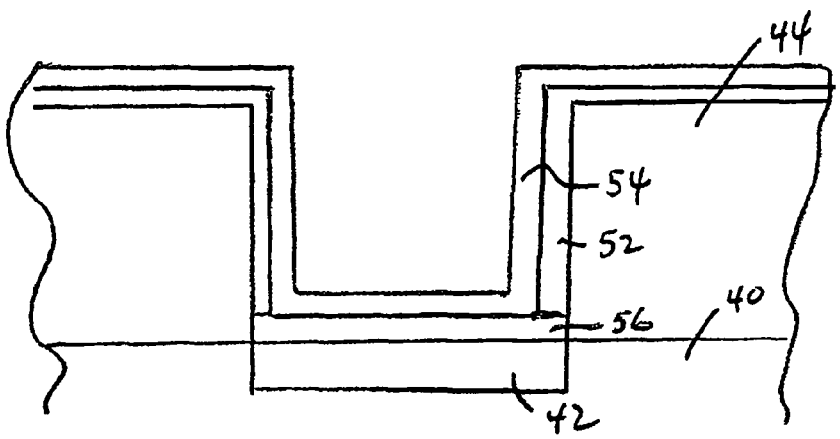
FIG. 8 depicts the structure of FIG. 7 following the formation of silicide, in accordance with embodiments of the present invention.

FIG. 8 depicts the structure of FIG. 7 following a rapid thermal anneal by conventional techniques to form the silicide region 56. Since the titanium of the metal contact layer 52 has not been converted to titanium nitride due to nitrogen penetration during a plasma treatment process, a larger titanium silicide region 56 is formed than in conventional methodologies. The tuning of the plasma treatment by appropriate control of the plasma treatment time ensures preservation of the titanium thickness to the largest extent possible.

Figure 9:
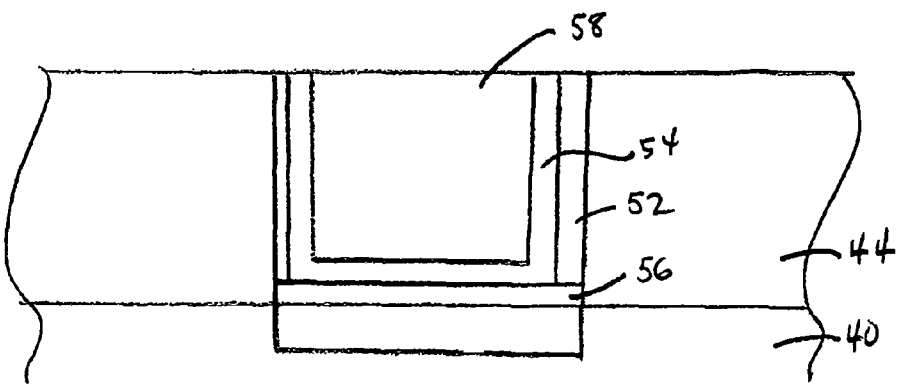
FIG. 9 shows the structure of FIG. 8 after a contact hole process and polishing to create the contact, in accordance with embodiments of the present invention.

FIG. 9 shows the structure of FIG. 8 following a conventional tungsten fill process and chemical-mechanical polishing, for example, to remove the metal layers from the top of the dielectric layer 44. Tungsten 58 may be filled in a conventional manner.

The contact of the present invention provides superior electrical performance for relatively small contacts, such as those provided in 65 nm, 45 nm and smaller technologies. The improved electrical conductivity in the contacts having high-aspect ratio small geometry is particularly challenging, and the present invention solves these problems by controlling plasma treatment time to prevent nitrogen penetration into an underlying titanium contact layer during the plasma treatment of an overlying barrier metal layer of titanium nitride. This preserves the thickness of the titanium, allowing less titanium to be deposited than in conventional methodologies. At the same time, full treatment of the deposited MOCVD-TiN is assured to provide a quality barrier metal layer.

Although the present invention has been described and illustrated in detail, it is to be clearly understood that the same is by way of illustration and example only, and is not to be taken by way of limitation, the scope of the present invention being limited only by the terms of the appended claims.

What is claimed is:

1. A method of forming a contact in a semiconductor device, comprising the steps:
   forming a contact hole in a dielectric layer on a substrate containing a conductive region, the contact hole exposing a portion of the conductive region;
   forming a contact layer in the contact hole and on the conductive region portion;
   forming a barrier metal layer on the contact layer;
   plasma treating the barrier metal layer with a nitrogen-hydrogen plasma such that penetrated nitrogen concentration in the contact layer is less than 30 at. %; and
   forming a silicide region at the conductive region portion by reacting the contact layer with the conductive region portion,
   wherein the contact layer is titanium and the barrier metal layer is titanium nitride, the barrier metal layer is deposited to a thickness of between 25 to about 60 Å, the plasma is an $N_2/H_2$ plasma, the plasma treating includes exposing the barrier metal layer to the $N_2/H_2$ plasma for a period of between 15 and 35 seconds, and providing RF power between 700 and 850 W.

2. The method of claim 1, wherein the barrier metal layer is exposed to the $N_2/H_2$ plasma with RF power provided of about 750 W.

3. A method of forming a contact in a semiconductor wafer, comprising the steps:
- forming a titanium layer in a contact hole and on a conductive region portion of a substrate exposed by the contact hole;
- forming a titanium nitride layer on the titanium layer; and
- plasma treating the titanium nitride layer with a nitrogen-hydrogen plasma with treatment conditions preventing penetration of nitrogen into the titanium layer,
- wherein the treatment conditions include a plasma exposure time of between about 15 to about 25 seconds and an RF power between about 700 and about 850 W.

4. The method of claim 3, further comprising annealing the semiconductor wafer to cause the titanium layer to react with the conductive region portion to form titanium silicide.

5. A method of forming a contact in a semiconductor wafer, comprising the steps:
- forming a contact layer in a contact hole and on a conductive region portion of a substrate exposed by the contact hole;
- forming a barrier metal layer on the contact layer to a thickness;
- plasma treating the barrier metal layer with a nitrogen-hydrogen plasma for a determined amount of time based on the thickness of the barrier metal layer so as to remove impurities from the barrier metal layer and substantially prevent nitrogen from penetrating into the contact layer; and
- forming a silicide at the conductive region portion,
- wherein the contact layer is titanium and the barrier metal layer is titanium nitride, RF power is maintained at about 750 W and the titanium nitride is exposed to the nitrogen-hydrogen plasma for 15 to 35 seconds for every 25 to 60 Å of thickness of the barrier metal layer, and the nitrogen-hydrogen plasma is an $N_2/H_2$ plasma.

\* \* \* \* \*